US011233377B2

(12) United States Patent
Pao

(10) Patent No.: US 11,233,377 B2
(45) Date of Patent: Jan. 25, 2022

(54) PLANARIZATION OF BACKSIDE EMITTING VCSEL AND METHOD OF MANUFACTURING THE SAME FOR ARRAY APPLICATION

(71) Applicant: OEpic SEMICONDUCTORS, INC, Sunnyvale, CA (US)

(72) Inventor: Yi-Ching Pao, Sunnyvale, CA (US)

(73) Assignee: OEPIC SEMICONDUCTORS INC., Sunnyvale, CA (US)

( * ) Notice: Subject to any disclaimer, the term of this patent is extended or adjusted under 35 U.S.C. 154(b) by 0 days.

(21) Appl. No.: 16/258,976

(22) Filed: Jan. 28, 2019

(65) Prior Publication Data

US 2019/0237936 A1  Aug. 1, 2019

Related U.S. Application Data

(60) Provisional application No. 62/626,949, filed on Feb. 6, 2018, provisional application No. 62/622,668, filed on Jan. 26, 2018.

(51) Int. Cl.
| | |
|---|---|
| *H01S 5/183* | (2006.01) |
| *H01S 5/42* | (2006.01) |
| *H01S 5/0234* | (2021.01) |
| *H01S 5/042* | (2006.01) |
| *H01S 5/026* | (2006.01) |

(Continued)

(52) U.S. Cl.
CPC ........ *H01S 5/18369* (2013.01); *H01S 5/0234* (2021.01); *H01S 5/18305* (2013.01); *H01S 5/18341* (2013.01); *H01S 5/423* (2013.01); *H01S 5/026* (2013.01); *H01S 5/0237* (2021.01); *H01S 5/02345* (2021.01);
(Continued)

(58) Field of Classification Search
CPC ............... H01S 5/18305; H01S 5/0224; H01S 5/18347; H01S 5/18–187; H01S 5/18344–18352; H01S 5/04256; H01S 5/42–423
See application file for complete search history.

(56) References Cited

U.S. PATENT DOCUMENTS

| | | | | |
|---|---|---|---|---|
| 5,029,176 | A | * | 7/1991 | Chang-Hasnain ...... H01S 5/026 257/E21.097 |
| 5,031,187 | A | * | 7/1991 | Orenstein ........... H01S 5/18308 372/44.011 |

(Continued)

FOREIGN PATENT DOCUMENTS

| | | | | |
|---|---|---|---|---|
| JP | 04252090 | A | * | 9/1992 |
| JP | 07038196 | A | * | 2/1995 |

*Primary Examiner* — Joshua King
(74) *Attorney, Agent, or Firm* — Weiss & Moy, P.C.; Jeffrey D. Moy

(57) ABSTRACT

A method of forming a flip chip backside Vertical Cavity Surface Emitting Laser (VCSEL) package comprising: forming a VCSEL pillar array; applying a dielectric layer to the VCSEL pillar array, the dielectric layer filling trenches in between pillars forming the VCSEL pillar array and covering the pillars; planarizing the VCSEL pillar array to remove the dielectric layer covering the pillars exposing a metal layer on a top surface of the pillars; applying a metal coating on the metal layer on a top surface of the pillars, the metal layer defining a contact pattern of the VCSEL pillar array; and applying solder on the metal coating to flip chip mount the VCSEL pillar array to a substrate package.

8 Claims, 3 Drawing Sheets

(51) Int. Cl.
  *H01S 5/0237* (2021.01)
  *H01S 5/02345* (2021.01)
(52) U.S. Cl.
  CPC ....... *H01S 5/04254* (2019.08); *H01S 5/18388* (2013.01); *H01S 2301/176* (2013.01)

(56) References Cited

U.S. PATENT DOCUMENTS

| | | | | |
|---|---|---|---|---|
| 5,034,344 A * | 7/1991 | Jewell | ................... | B82Y 20/00 438/34 |
| 5,073,041 A * | 12/1991 | Rastani | ................... | H01S 5/423 372/101 |
| 5,104,824 A * | 4/1992 | Clausen, Jr. | ........ | H01L 21/3081 148/DIG. 26 |
| 5,216,263 A * | 6/1993 | Paoli | ................... | B41J 2/45 257/88 |
| 5,436,922 A * | 7/1995 | Mori | ................... | H01L 33/0062 372/50.124 |
| 5,537,666 A * | 7/1996 | Mori | ................... | H01L 33/0062 372/45.013 |
| 5,554,061 A * | 9/1996 | Park | ................... | H01S 5/18347 445/28 |
| 5,661,076 A * | 8/1997 | Yoo | ................... | H01S 5/18347 438/39 |
| 5,883,914 A * | 3/1999 | Kinoshita | .............. | B82Y 20/00 372/50.1 |
| 6,177,359 B1 * | 1/2001 | Chen | ................... | H01L 21/2007 257/E21.122 |
| 6,275,513 B1 * | 8/2001 | Chang-Hasnain | .... | H01S 5/0222 372/107 |
| 6,859,476 B2 * | 2/2005 | Kaneko | ................. | B82Y 20/00 257/E27.12 |
| 6,888,871 B1 * | 5/2005 | Zhang | ................... | H01S 5/423 372/36 |
| 7,256,483 B2 * | 8/2007 | Epler | ................. | H01L 33/0079 257/676 |
| 8,076,693 B2 * | 12/2011 | Shi | ................... | H01L 33/507 257/79 |
| 8,759,865 B2 * | 6/2014 | Tsai | ................... | H01L 33/10 257/98 |
| 8,995,493 B2 * | 3/2015 | Joseph | ................... | H01S 5/183 372/50.12 |
| 9,324,926 B2 * | 4/2016 | Schricker | ............ | H01L 25/0753 |
| 9,543,478 B2 * | 1/2017 | Schricker | ............ | H01L 25/0753 |
| 10,205,303 B1 * | 2/2019 | Hegblom | ............ | H01S 5/04254 |
| 2002/0173089 A1 * | 11/2002 | Zhu | ..................... | H01S 5/18305 438/200 |
| 2004/0042523 A1 * | 3/2004 | Albrecht | ................ | H01S 5/041 372/70 |
| 2005/0100070 A1 * | 5/2005 | Nakayama | .......... | H01S 5/18355 372/50.1 |
| 2007/0071056 A1 * | 3/2007 | Chen | ..................... | G01S 7/4814 372/50.124 |
| 2007/0091961 A1 * | 4/2007 | Lin | ..................... | H01S 5/18313 372/50.124 |
| 2008/0031295 A1 * | 2/2008 | Tanaka | ................ | H01S 5/18305 372/44.01 |
| 2008/0054291 A1 * | 3/2008 | Kim | ....................... | B82Y 20/00 257/103 |
| 2008/0212636 A1 * | 9/2008 | Sato | .................... | H01S 5/18311 372/50.11 |
| 2008/0254566 A1 * | 10/2008 | Yokouchi | ........... | H01S 5/18313 438/93 |
| 2009/0303308 A1 * | 12/2009 | Itoh | ..................... | G02B 26/123 347/256 |
| 2010/0103972 A1 * | 4/2010 | Saito | .................... | B82Y 20/00 372/50.1 |
| 2010/0303113 A1 * | 12/2010 | Joseph | .................... | H01S 5/423 372/36 |
| 2011/0037825 A1 * | 2/2011 | Jikutani | ............... | H01S 5/18311 347/243 |
| 2011/0165707 A1 * | 7/2011 | Lott | ......................... | H01L 33/60 438/27 |
| 2013/0033559 A1 * | 2/2013 | Sasaki | ..................... | B41J 2/455 347/224 |
| 2013/0092850 A1 * | 4/2013 | Ootorii | ................. | H01L 31/167 250/552 |
| 2013/0163626 A1 * | 6/2013 | Seurin | ..................... | F21V 29/56 372/35 |
| 2015/0063387 A1 * | 3/2015 | Joseph | ................ | H01S 5/02438 372/36 |
| 2015/0255955 A1 * | 9/2015 | Wang | ................... | H01S 5/18347 438/29 |
| 2017/0033535 A1 * | 2/2017 | Joseph | ................ | H01S 5/18308 |
| 2020/0014169 A1 * | 1/2020 | Yu | ........................... | H01L 24/00 |

* cited by examiner

PLANARIZATION OF BACKSIDE EMITTING VCSEL AND METHOD OF MANUFACTURING THE SAME FOR ARRAY APPLICATION

RELATED APPLICATIONS

This patent application is related to U.S. Provisional Application No. 62/622,668 filed Jan. 26, 2018, entitled "FLIP CHIP PACKAGE OF BACKSIDE ILLUMINATING VCSEL FOR 3D SENSING ARRAY" and U.S. Provisional Application No. 62/626,949 filed Feb. 6, 2018, entitled "PLANARIZATION OF BACKSIDE ILLUMINATING VCSEL AND MANUFACTURING THE SAME FOR ARRAY APPLICATIONS" both in the name of Yi-Ching Pao, and which both of which are incorporated herein by reference in its entirety. The present patent application claims the benefit under 35 U.S.C § 119(e).

TECHNICAL FIELD

The present invention generally relates to vertical cavity surface emitting lasers (VCSELs) and, more particularly to, a flip chip VCSEL which eliminates the need for bond wires and bond pads thereby reducing the footprint of the flip chip VCSEL device and which utilizes planarization of trenches formed between pillars in the VCSEL pillar array for ease of subsequent photolithography and metal related manufacturing processes.

BACKGROUND

Semiconductor lasers are being used in many imaging applications which require high power illumination such as structured light sources for 3D imaging, Laser Detection and Ranging (LADAR), Time of Flight (TOF) 3D imaging, aviation defense, and fusion research, among others. Vertical Cavity Surface Emitting Lasers (VCSELs), are commonly used in many semiconductor laser applications due to the low power applications and high frequency superiority and manufacturing advantages over other type of semiconductor laser devices.

A VCSEL is a semiconductor micro-laser diode that emits light in a generally cylindrical beam. The beam is emitted vertically from the surface of the substrate on which it is fabricated. Because the beams in VCSELs emit vertically from the surface of the substrate, they can be tested on-wafer, before they are separated into individual devices. This reduces the fabrication cost of the devices. It also allows VCSELs to be built not only in one-dimensional, but also in two-dimensional arrays.

VCSELs generally have larger output apertures compared to most edge-emitting lasers. This may allow VCSELs to produce a lower divergence angle of the output beam, and makes possible high coupling efficiency with optical fibers. VCSELs also have high reflectivity mirrors, compared to most edge-emitting lasers, which may reduce the threshold current of VCSELs, resulting in low power consumption. The low threshold current also permits high intrinsic modulation bandwidths in VCSELs. The wavelength of VCSELs may also be tuned, within the gain band of the active region, by adjusting the thickness of the reflector layers.

In a VCSEL package assembly, the VCSEL device is frontside mounted to a substrate of the package by solder or epoxy. Wire bonding may then be used to attach the VCSEL device to external circuitry. The drawback of wire bonding of a front side emitting VCSEL is that wire bonding increases the footprint of the VCSEL package assembly. Also, since the active region (where the heat is being generated) is on the top side of the wafer, the heat source is farther away from the heatsink which is located at the back of the wafer. This will significantly raise the junction temperature of the VCSEL as the heat is not removed quickly from the front side of the wafer.

Therefore, it would be desirable to provide a device and method that overcome the above problems.

SUMMARY

In accordance with one embodiment, a method of forming a flip chip backside Vertical Cavity Surface Emitting Laser (VCSEL) package is disclosed. The method comprises: forming a VCSEL pillar array; applying a dielectric layer to the VCSEL pillar array, the dielectric layer filling trenches in between pillars forming the VCSEL pillar array and covering the pillars; planarizing the VCSEL pillar array to remove the dielectric layer covering the pillars exposing a metal layer on a top surface of the pillars; applying a metal coating on the metal layer on a top surface of the pillars, the metal layer defining a contact pattern of the VCSEL pillar array; and applying solder on the metal coating to flip chip mount the VCSEL pillar array to a substrate package.

In accordance with one embodiment, a method of forming a flip chip backside Vertical Cavity Surface Emitting Laser (VCSEL) package is disclosed. The method comprises: forming a VCSEL pillar array comprising: forming a first mirror device on a substrate; forming an active region on the first mirror device; forming a second mirror device formed on the active region; applying a metal layer on the second mirror device; and forming a plurality of pillars, the pillar exposing a portion of the first mirror device, the active region and the second mirror device; applying a dielectric layer to the VCSEL pillar array, the dielectric layer filling trenches in between pillars forming the VCSEL pillar array and covering the pillars; planarizing the VCSEL pillar array to remove the dielectric layer covering the pillars exposing a metal layer on a top surface of the pillars; applying a metal coating on the metal layer on a top surface of the pillars, the metal layer defining a contact pattern of the VCSEL pillar array, wherein the metal coating may attach a plurality of pillars together; and applying solder on the metal coating to flip chip mount the VCSEL pillar array to a substrate package.

In accordance with one embodiment, a flip chip backside Vertical Cavity Surface Emitting Laser (VCSEL) package is disclosed. The flip chip backside Vertical Cavity Surface Emitting Laser (VCSEL) package has a VCSEL pillar array. A dielectric layer fills trenches in between pillars forming the VCSEL pillar array. The VCSEL pillar array is planarized to expose a metal layer on a top surface of the pillars. A metal coating is applied on the metal layer on the top surface of the pillars. The metal layer defines a contact pattern of the VCSEL pillar array, wherein the metal coating attaches a plurality of pillars together. Solder is applied on the metal coating to flip chip mount the VCSEL pillar array to a substrate package.

BRIEF DESCRIPTION OF THE DRAWINGS

The present application is further detailed with respect to the following drawings. These figures are not intended to limit the scope of the present application but rather illustrate certain attributes thereof. The same reference numbers will be used throughout the drawings to refer to the same or like parts.

DESCRIPTION OF THE APPLICATION

The description set forth below in connection with the appended drawings is intended as a description of presently preferred embodiments of the disclosure and is not intended to represent the only forms in which the present disclosure can be constructed and/or utilized. The description sets forth the functions and the sequence of steps for constructing and operating the disclosure in connection with the illustrated embodiments. It is to be understood, however, that the same or equivalent functions and sequences can be accomplished by different embodiments that are also intended to be encompassed within the spirit and scope of this disclosure.

Referring to FIGS. 1A-4B, an exemplary embodiment of a method for forming a flip chip backside emitting VCSEL package 10 may be seen. The VCSEL package 10 has multiple advantages over the prior art designs namely: (1) flip-chip configuration with one step reflow assembly process, (2) planarization of etched trenches forming a VCSEL array of the VCSEL package 10 for ease of subsequent photolithography and metal related manufacturing processes, and (3) backside illuminating VCSEL with options of aperture lens and other optical arrangements on the backside of the wafer. In accordance with one embodiment, the wavelength of the present embodiment of the VCSEL package 10 is 940 nm or 1120 nm or 1400 nm for 3D sensing applications or 980 nm for power applications such as fiber pump lasers.

Figure 1A:
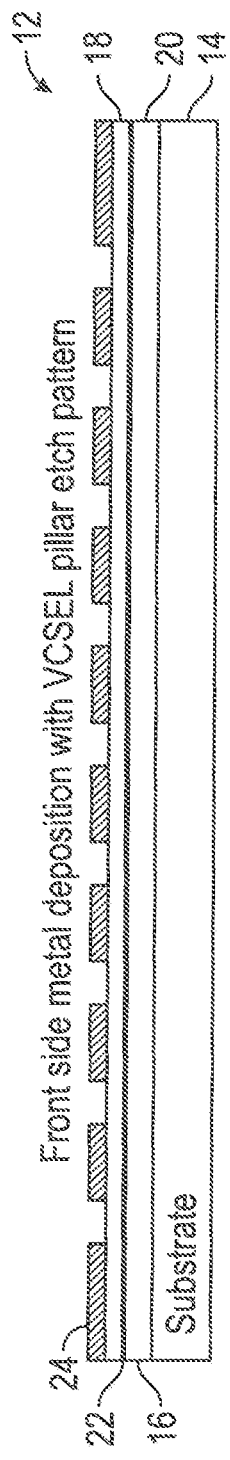
FIGS. 1A-1E are cross-sectional views showing exemplary embodiments of forming a VCSEL pillar array for flip chip mounting in accordance with one aspect of the present application.

Referring to FIG. 1A, the VCSEL array 12 may be formed on a substrate 14. The substrate 14 may be a gallium arsenide (GaAs) substrate 14 or similar material. Materials 16 may be deposited on the substrate 14 to form the VCSEL array 12. In accordance with one embodiment, a pair of Distributed Braggs Reflectors (DBR) 18 and 20 may be formed on the substrate 14 and runs parallel to the substrate 14. The DBRs 18 and 20 may be formed of a plurality of layers. The DBRs 18 and 20 may be formed by disposing multiple layers of alternating materials with varying optical impedances. In general, the multiple layers alternate between high and low optical impedances.

An active region 22 may be formed between the pair of DBRs 18 and 20. The active region 22 may be formed of one or more quantum wells for laser light generation. Metal contact layer 24 may be formed on the materials 16. In the present embodiment, the metal contact layer 24 may be formed on top of the DBR 18.

The VCSEL array 12 may then be formed. The VCSEL array 12 may be formed in a manner described in co-pending patent application entitled "PILLAR CONFINED BACKSIDE ILLUMINATING VCSEL", having Ser. No. 16/208,958, in the name of Yi-Ching Pao, Majid Riaziat, Ta-Chung Wu, Wilson Kyi and James Pao and which is incorporated herein by reference in its entirety.

Figure 1B:
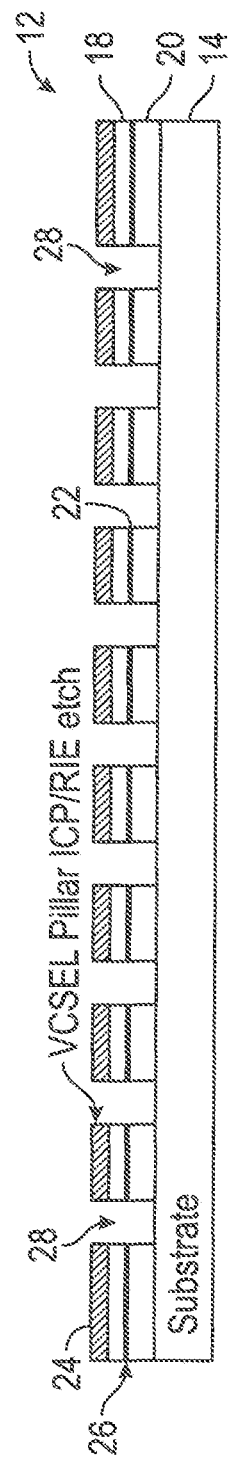
Figure 1C:
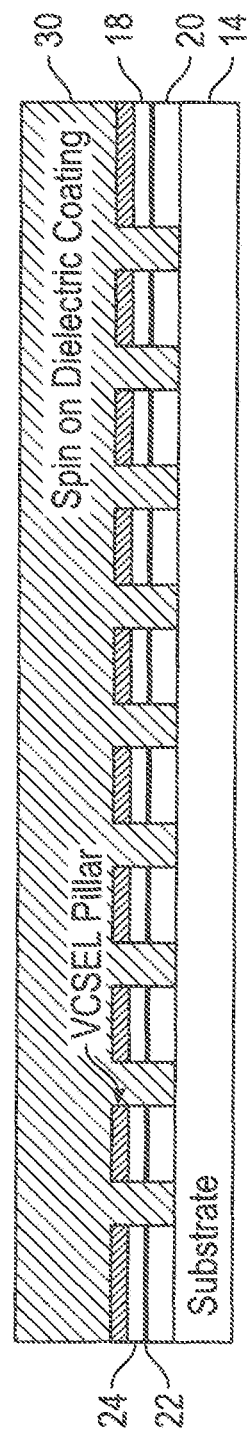

As may be seen in FIG. 1B, the VCSEL array 12 may be formed by etching a plurality of pillars 26. The pillars 26 may be isolated from one another by a trench 28 formed in between. The pillars 26 may be etched to a depth exposing a portion of the DBR 20, the active region 22 and the DBR 18. In the present embodiment, a highly directional ICP (Inductive Coupled Plasma) reactive ion etcher (RIE) may be used to etch highly anisotropic pillars 26. By using ICP-RIE, the pillars 26 may have a cylinder type of cross-sectional profile having close to straight side walls. In accordance with one embodiment, the pillars 26 may have a profile in the 5-50 µm diameter range. Etching by using ICP-RIE may be important since if wet chemical isotropic etchant is used, the side walls of the pillars 26 may be tapered which may present issues when small diameter VCSELs are to be fabricated. Thus, the pillars 26 should be etched by ICP-RIE with an anisotropic straight wall profile.

A coating 30 may be applied to the VCSEL array 12. The coating 30 may be a spin-on glass dielectric such as Polyimide, Benzocyclobutene (BCB) or any solvent based chemical dielectric film. The coating 30 may be applied to flow into the trenches 28 and cover the etched surfaces of the pillars 26 forming the VCSEL array 12.

Figure 1D:
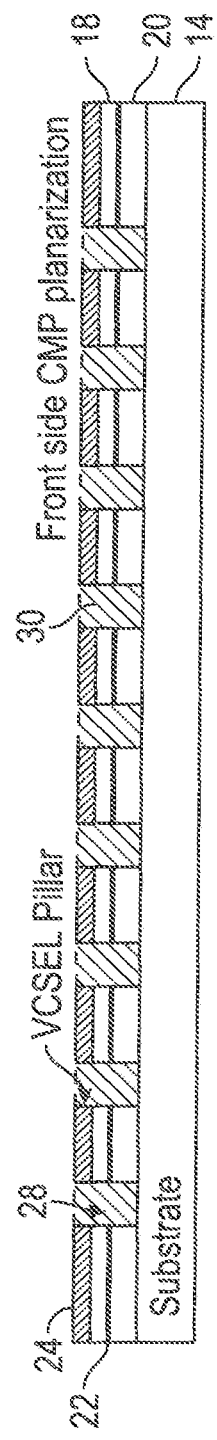

A chemical mechanical polishing (CMP) process may be applied to the VCSEL array 12 as shown in FIG. 1D. The CMP process is a process of smoothing surfaces with the combination of chemical and mechanical forces. The CMP process may be used to expose the metal contacts 24. The metal contacts 24 may act as the polishing or etch stopper as shown in FIG. 1D.

Figure 1E:
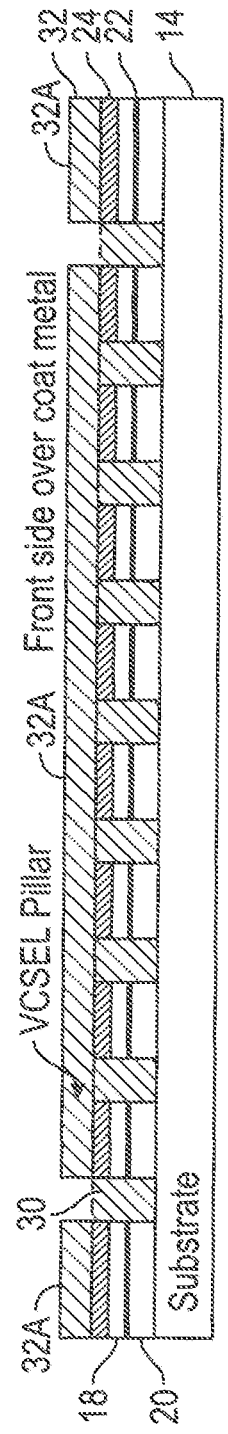

Once the surface of the VCSEL array 12 is CMP planarized exposing the metal contacts 24, an over coat of metal 32 may be deposited as shown in FIG. 1E. The over coat of metal 32 may serve as both electric and thermal connections and also as a solder adhesion base as will be described below.

Figure 2A:
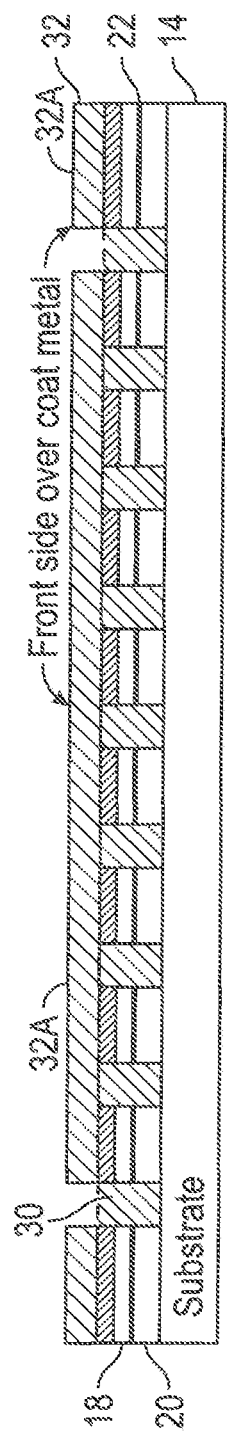
FIGS. 2A-2B are cross-sectional views showing exemplary embodiments of forming a flip chip backside emitting VCSEL package using the VCSEL pillar array formed in FIGS. 1A-1E in accordance with one aspect of the present application.

As shown in FIGS. 1E and 2A, once the surface of the VCSEL array 12 is CMP planarized, an over coat of metal 32 may be deposited to define a contact pattern 32A. Different groups of pillars 26 may be attached together to form the contact pattern 32A. In the present embodiment, all of the pillars 26 in an interior of the VCSEL array 12 may be coupled together, while the pillars 26 on the perimeter are not. As stated above, the contact pattern 32A may serve as both electric and thermal connections and also as a solder adhesion base.

Figure 2B:
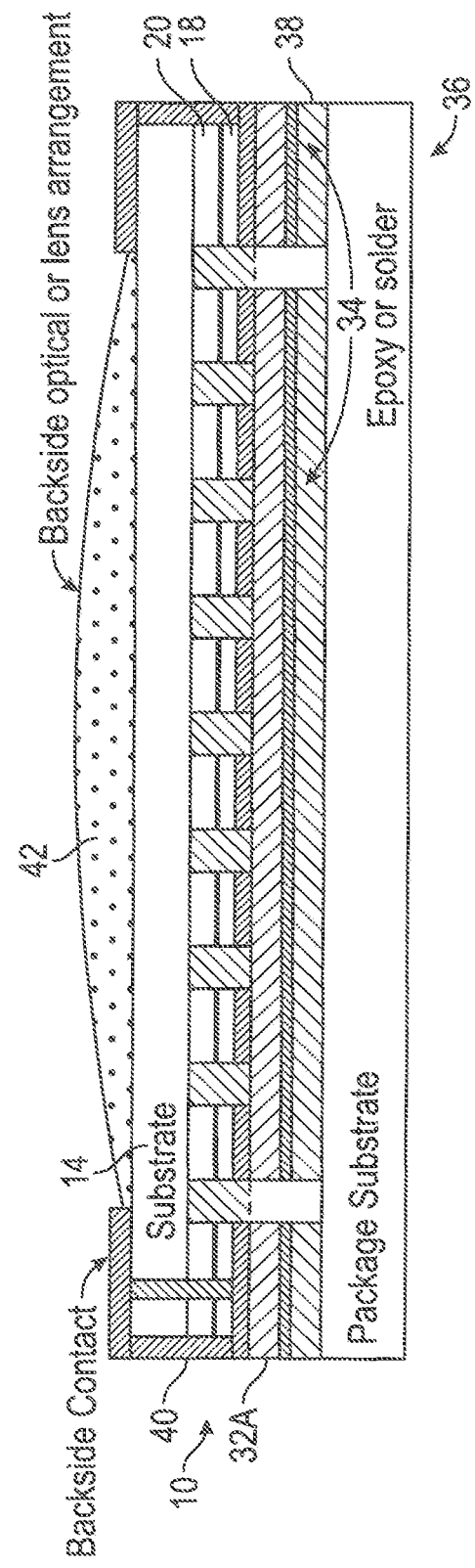

A solder or conductive epoxy 34 (hereinafter solder 34) may be applied to the contact pattern 32A as may be seen in FIG. 2B. The VCSEL array 12 may be flip-chip mounted to a package substrate 36 forming the backside emitting VCSEL package 10.

Since the present embodiment is designed for backside illumination VCSEL, a flip-chip configuration may be required. In the prior art, the flip-chip mounting is based on dedicated solder bumps or solder over the VCSEL pillars or mesas which are placed over the VCSEL pillars (or mesas). In the present embodiment, the VCSEL array 12 has the solder coverage over the top of each and every VCSEL pillar 32. This is done by electric-chemical plating a thin layer of solder 34 such as Au—Sn on top of the contact pattern 32A, and then turn the VCSEL array 12 upside down to meet and join (through a furnace re-flow process) the receiving end of metal pads 38 on the package substrate 36 or heat sinking substrate side. The VCSEL array 12 may have an aperture lens and other optical arrangements 42 attached to the backside of the VCSEL array 12.

The VCSEL package 10 may use a backside illuminating VCSEL array 12 configured in a flip-chip arrangement and may use electrical connections 40 such as vias or wrap around connections to reach the back side of the substrate 14, metal contacts and/or optical arrangement 42 without the need of any bond wires in the assembly and packaging process as described in co-pending patent application entitled "FLIP CHIP BACKSIDE EMITTING VCSEL PACKAGE", having Ser. No. 16/239,083, in the name of Yi-Ching Pao and which is incorporated herein by reference in its entirety.

The present embodiments describe a backside emitting VCSEL array 12 configured with Flip-chip arrangement plus the use of planarization of the etched trenches 30 in between the pillars 26 to ease the subsequent photolithography and metal deposition processes. Complete assembly to attach the VCSEL array 12 and make all needed electrical connections to the package substrate 36 may be done by a simple solder reflow process with solder tip "over" the VCSEL pillar 26 and also the electrical connections 40 such as vias or wrap around connections. This feature eliminates the need of a typical two-step process of die attach first and wire bonding the next, which simplify the assembly and packaging process into one re-flow process plus it can drastically reduce the footprint of the package size by eliminating the lengthy bond wires and extended bond pads outside the chip area. This arrangement greatly increases the yield of the packaged VCSEL array 12 and at the same time reduce the form factors and footprint of the VCSEL package 10 dramatically.

The bond wire arrangement generally requires bond pads to extend outside the footprint of the VCSEL array 12. The bond wire arrangement may extend the footprint of the whole assembly by 2× the actual size of the VCSEL array 12 in any given dimension. Thus, in a two-dimensional (X and Y) arrangement this means the footprint of the VCSEL package 10 may be as large as 4× of the actual VCSEL array 12. This large footprint required by the prior art is a major concern in any space limited handheld applications such as handset and any mobile device.

While embodiments of the disclosure have been described in terms of various specific embodiments, those skilled in the art will recognize that the embodiments of the disclosure may be practiced with modifications within the spirit and scope of the claims.

What is claimed is:

1. A method of forming a flip chip backside emitting Vertical Cavity Surface Emitting Laser (VCSEL) package comprising:
    forming a VCSEL pillar array comprising:
    forming a first mirror device on a substrate;
    forming an active layer applied directly on the first mirror device generating light;
    forming a second mirror device directly attached to the active layer;
    applying a metal layer on the second mirror device; and
    forming a plurality of pillars, wherein the second mirror device is directly attached to the active layer across an entire width of each pillar, each pillar exposing a portion of the first mirror device, the active region and the second mirror device, wherein each pillar has a diameter between 5-50 μm;
    applying a dielectric layer to the VCSEL pillar array, the dielectric layer filling trenches in between VCSEL pillars forming the VCSEL pillar array, covering the VCSEL pillars and the metal layer;
    planarizing the VCSEL pillar array to remove the dielectric layer covering the VCSEL pillars exposing the metal layer on a top surface of the VCSEL pillars;
    applying a metal coating on the metal layer on the top surface of the VCSEL pillars, the metal layer defining a contact pattern of the VCSEL pillar array, wherein the metal coating attaches a plurality of VCSEL pillars together, and
    applying solder on the metal coating to flip chip mount the VCSEL pillar array to a substrate package.

2. The method of claim 1, comprising forming electrical connections around a perimeter of the VCSEL pillar array connecting a back side of the substrate of the VCSEL array and the substrate package.

3. The method of claim 2, wherein forming the electrical connections comprises forming is at least one wrap around connection.

4. The method of claim 2, wherein forming the electrical connections comprises forming at least one conductive via.

5. The method of claim 1, wherein forming a VCSEL pillar array comprises forming a plurality of pillars by directional Inductive Coupled Plasma-Reactive Ion Etcher (ICP-RIE).

6. The method of claim 1, wherein the dielectric layer is one of a Polyimide, Benzocyclobutene (BCB) or a solvent based chemical dielectric film.

7. The method of claim 1, wherein planarizing the VCSEL pillar array to remove the dielectric layer covering the pillars comprises applying a chemical mechanical polishing (CMP) process to the VCSEL array, wherein the metal layer is a CMP index and polish stopper.

8. The method of claim 1, comprising attaching an optical accessory to a backside of the VCSEL array.

* * * * *